United States Patent [19]

Sticher

[11] Patent Number: 4,639,611
[45] Date of Patent: Jan. 27, 1987

[54] BRIDGE CIRCUIT SYSTEM

[75] Inventor: Charles K. Sticher, Snellville, Ga.

[73] Assignee: Nordson Corporation, Amherst, Ohio

[21] Appl. No.: 689,829

[22] Filed: Jan. 9, 1985

[51] Int. Cl.⁴ .................. G05D 23/24; H05B 1/02
[52] U.S. Cl. .................... 307/117; 307/116; 307/132 T; 307/132 EA; 219/497; 219/499; 361/42; 323/365; 323/366
[58] Field of Search ............... 307/116, 117, 132 EA, 307/132 T; 219/497, 699; 361/42, 50; 323/365, 366, 367

[56] References Cited

U.S. PATENT DOCUMENTS

| | | | |
|---|---|---|---|
| 3,548,155 | 12/1970 | Rabindran | 219/499 X |
| 3,821,642 | 6/1974 | Seymour | 323/367 X |
| 3,918,636 | 11/1975 | Dawson | 219/499 X |
| 3,946,200 | 3/1976 | Juodikis | 219/499 |
| 4,035,787 | 7/1977 | Hornung | 340/228 R |
| 4,086,466 | 4/1978 | Scharlack | 219/499 X |
| 4,159,501 | 6/1979 | White | 361/42 X |
| 4,186,315 | 1/1980 | Benton | 307/117 |
| 4,254,906 | 3/1981 | Hayes | 307/117 X |
| 4,320,285 | 3/1981 | Koether | 219/497 |
| 4,322,594 | 3/1982 | Brisson | 219/499 X |
| 4,393,300 | 7/1983 | Proctor | 219/497 |
| 4,415,790 | 11/1983 | Diesch et al. | 219/499 X |
| 4,439,805 | 3/1984 | Tarleton | 361/92 |
| 4,467,182 | 8/1984 | Merkel | 219/497 |
| 4,506,146 | 3/1985 | Rice et al. | 219/499 |
| 4,524,264 | 6/1985 | Takeuchi et al. | 219/497 |
| 4,532,468 | 7/1985 | Nishida et al. | 323/367 |
| 4,554,439 | 11/1985 | Cross et al. | 219/497 |

FOREIGN PATENT DOCUMENTS 2347191 8/1975 Fed. Rep. of Germany .
57-77483 11/1983 Japan .

Primary Examiner—William M. Shoop, Jr.
Assistant Examiner—Shik Luen Paul Ip
Attorney, Agent, or Firm—Wood, Herron & Evans

[57] ABSTRACT

A sensing circuit system including circuitry for sensing impedance variations of a variable impedance element. As disclosed, a bridge circuit system includes a bridge circuit to which the variable impedance element is couplable. The bridge circuit system further includes circuitry for detecting open circuit or short circuit fault conditions of the variable impedance element. The variable impedance element is coupled to the bridge circuit by a connector, having two connector components, which is also operable to couple the fault detection circuitry to the bridge circuit only when the two components of the connector are connected together.

6 Claims, 1 Drawing Figure

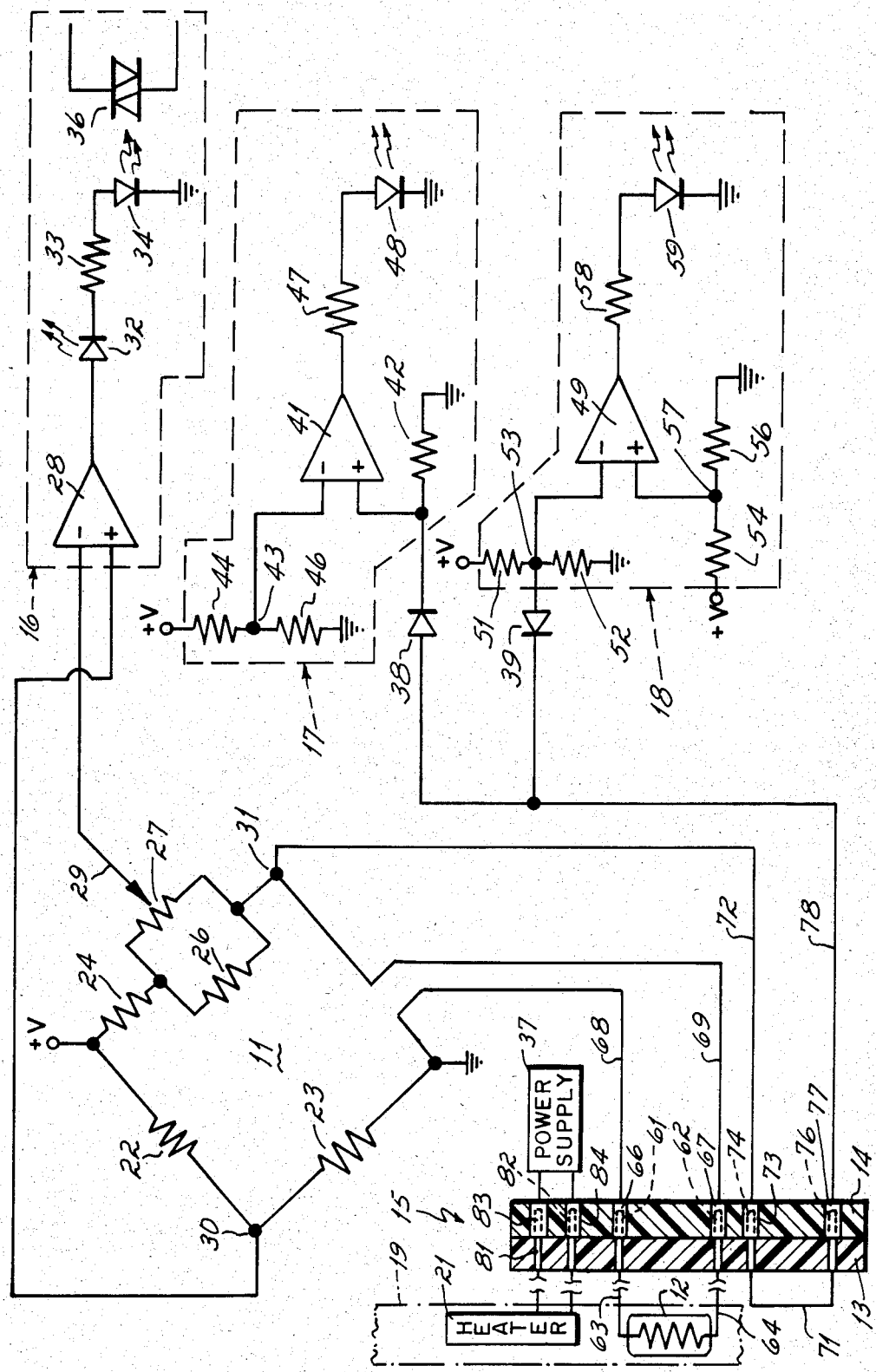

BRIDGE CIRCUIT SYSTEM

DESCRIPTION OF THE INVENTION

This invention relates generally to sensing circuits and more particularly concerns such circuits which include sensor fault indicating circuitry. The invention is disclosed in the form of a balanced bridge sensing circuit having a sensor element in one leg of the bridge.

Balanced bridge sensing circuits are used in a variety of applications for monitoring such parameters as pressure, temperature, fluid level, and the like. To do this, one leg of the bridge circuit includes an element whose impedance varies in dependence upon the value of the parameter to be measured.

For example, in a temperature sensing system employing a resistance bridge, a temperature dependent resistor is physically placed at a location at which the temperature is to be sensed or measured, and the temperature dependent resistor is electrically connected to one leg of a resistance bridge. The resistance bridge is often located remote from the temperature dependent resistor. Temperature variations at the temperature dependent resistor result in resistance variations of the resistor, which are in turn sensed by circuitry connected to the resistance bridge. This circuitry can be calibrated to, for example, provide an output indicative of the temperature at the location of the temperature dependent resistor, or to produce an electrical signal to control a heater.

Often, circuitry is coupled to the leg of the bridge circuit containing the temperature dependent resistor for indicating short circuit or open circuit conditions of the temperature dependent resistor. This circuitry may also indicate extremely high temperatures, such as may arise in the case of a runaway heater. In this way, it can be readily determined if there is a difficulty with the temperature dependent resistor itself or if an overtemperature heater condition has arisen.

A typical way of providing such fault condition indication in sensor circuits is to monitor the voltage across the sensor, such as the temperature dependent resistor. If an open circuit should occur in the leads to the temperature dependent resistor or within the temperature dependent resistor itself, this monitored voltage rises to approximately the level of the bridge supply voltage. If a short circuit should occur in the temperature dependent resistor, or its leads, than the monitored voltage will become approximately zero.

This monitored, fault condition voltage of the temperature dependent resistor is coupled to suitable threshold detectors, which provide an open circuit or short circuit indication in case one of these fault conditions should arise at the temperature dependent resistor.

In some bridge circuits of the foregoing type, the temperature dependent resistor may be disconnected from the bridge circuit. For example, as will be noted below with regard to an exemplary embodiment of the invention, a temperature dependent resistor is removably coupled to a bridge circuit for sensing the temperature of a heated hose in a hot melt adhesive dispensing system. When the adhesive hose is not in use, the hose heater and the temperature dependent resistor for the hose are usually disconnected from the heater power supply and the bridge circuit, respectively.

When a temperature dependent resistor fault sensing circuit is connected to the bridge, removing the temperature dependent resistor from the bridge circuit results in an open circuit fault indication. This occurs since the fault sensing circuitry is coupled to the full bridge supply voltage when the temperature dependent resistor is removed. In the past, in order to avoid this erroneous open circuit indication, a manual switch has been provided to disconnect the fault sensing circuitry from the bridge.

One form of switch for this purpose is a simple toggle switch in the line from the bridge to the fault sensing circuitry. This adds the cost of the switch to the fault sensing circuitry. Further, an operator of the system can override an overheat indication by simply flipping the switch, or the operator may inadvertently leave the switch in the "off" position when the hose heater and temperature dependent resistor are recoupled to the system.

Another type of switch which has been employed to overcome the problem of a false indication of a temperature dependent resistor fault condition is a switch incorporated in a temperature control knob. In this way, when a hose heater and temperature dependent resistor are disconnected from the system, and the temperature-setting knob for the heater turned down to zero, a switch is opened, disconnecting the fault sensing circuitry from the bridge. This approach has the drawback that this type of switch is expensive. In addition, if a hose heater is turned off using the temperature-setting knob, but the hose heater left connected to the system, it is still possible for the heater to be energized due to a fault in the heater power supply control system. If this should occur, the over-temperature detector circuitry is disabled and does not reflect the over-temperature condition.

It is the general aim of the present invention to provide means for disconnecting fault sensing circuitry of the foregoing type from a sensing circuit, while avoiding the above-described disadvantages.

This objective has been accomplished in accordance with certain principles of the invention by providing means for disconnecting fault sensing circuitry from a sensor circuit automatically when the sensor is disconnected. In the embodiment of the invention to be described hereinafter, a temperature dependent resistor is coupled to a resistance bridge circuit through a plug and receptacle, with the plug further carrying a jumper which connects the fault sensing circuitry to the bridge only when the temperature dependent resistor is connected to the bridge.

In this way, when the temperature dependent resistor is in the bridge circuit, the fault sensing circuitry, as well as the temperature sensing circuitry, is operational. Further, the fault sensing circuitry cannot be disconnected without removing the temperature dependent resistor from the bridge. In systems in which a heater is also energized via leads coupled through the plug and receptacle, the fault sensing circuitry is also always connected whenever the heater is energized.

Other objects and advantages of the invention, and the manner of their implementation will become apparent upon reading the following detailed description and upon reference to the single drawing FIGURE showing a bridge circuit system in accordance with the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but, on the contrary, the intention is to cover all modifications, equivalents, and alternatives falling within the spirit and scope of the invention as defined by the appended claims.

With reference now to the drawing, a resistance bridge circuit 11 includes a positive temperature coefficient temperature dependent resistor 12, which is coupled to the bridge circuit through a connector 15, made up of an interconnected plug 13 and receptacle 14. Coupled to the bridge 11 is a temperature sensing circuit 16 which produces a temperature-dependent output, a temperature dependent resistor open circuit fault detection circuit 17, and a temperature dependent resistor short circuit fault detection circuit 18. The circuit 16 produces an output which is dependent upon the temperature at the temperature dependent resistor 12 and the setting of a potentiometer in the bridge 11, as shall be described hereinafter. In the illustrated form of the invention, the temperature dependent resistor 12 is mounted on a hot melt adhesive hose, indicated schematically as 19, which also carries a heater 21. While the heater 21 is shown schematically herein, it may take the form of, for example, a spirally wound resistance element on the hose 19.

The bridge circuit 11 has a first leg including resistors 22 and 23, and a second leg including a resistor 24, a resistor 26 connected in parallel with a potentiometer 27, and the temperature dependent resistor 12. One input to a comparator 28 in the temperature sensing circuit 16 is coupled to a node 30 of the bridge 11 between the resistors 22 and 23. The second input to the comparator 28 is coupled to the wiper arm 29 of the potentiometer 27.

As the temperature of the temperature dependent resistor 12 increases, the voltage at a node 31 of the bridge becomes greater, as does the voltage at the wiper arm 29 of the potentiometer 27. Depending upon the setting of the wiper arm 29 of the potentiometer 27, a greater or lesser voltage, which varies with the temperature of the temperature dependent resistor 12, is coupled to the inverting input of the comparator 28. The voltage at the node 30 of the bridge 11 is coupled to the non-inverting input of the comparator 28. If the voltage at the wiper arm 29 exceeds the voltage at the node 30 of the bridge, the output of the comparator 28 is at a logic low, such as zero volts or ground. If the temperature at the temperature dependent resistor 12 falls below a set-point level, the voltage at the wiper arm 29 falls below that at the node 30, and the output of the comparator 28 is a positive voltage. This positive output of the comparator 28 results in current flow through a light-emitting diode 32, a resistor 33, and a light-emitting diode 34.

The light emitting diode 32 provides a visual indication of the less than set point value of the hose temperature. The light-emitting diode 34 forms a portion of an optical isolator, energizing a light-activated switch 36, typically in a control circuit for the heater 21. When the switch 36 is actuated, the heater 21 is energized by a power supply 37, providing closed loop servo-control for the heater 21. Many types of heater control circuit may be employed, or the heater control eliminated entirely, without affecting the operation of the inventive sensor circuit system.

The fault sensing circuitry 17, for providing a temperature dependent resistor open circuit fault indication, and the short circuit fault indication circuitry 18, is coupled to the node 31 of the bridge via the plug 13 and receptacle 14. In order to do this, the node 31 is coupled to the anode of a diode 38 whose cathode is connected to the open circuit fault sensing circuitry 17, and to the cathode of a diode 39 whose anode is connected to the short circuit fault sensing circuitry.

The voltage at the node 31 is coupled through the diode 38 to the non-inverting input of a comparator 41, which is also coupled to ground via a resistor 42. A reference voltage is supplied to the inverting input of the comparator 41. The reference voltage is supplied from a node 43 between resistors 44, 46 connected in series between the supply voltage and ground. In the event of an open circuit in the temperature dependent resistor 12, or in its connecting conductors to the bridge 11, the voltage at the node 31 rises to approximately the positive supply voltage. At about the time that the voltage at the node 31 exceeds the reference voltage at the node 43, the output of the comparator 41 becomes positive, and this positive voltage is coupled through a resistor 47 to a light-emitting diode 48, serving as an indicator of an open circuit fault condition. The comparator 41 also senses an overtemperature condition in which the resistance of the temperature dependent resistor rises sufficiently so that the voltage at the node 31 exceeds the reference voltage at the node 43.

In the short circuit fault condition indicator circuitry 18, a comparator 49 has an inverting input coupled to the anode of the diode 39, the cathode of which is coupled to the node 31 of the bridge 11. A reference voltage is applied to the inverting input of the comparator 49 by series resistors 51, 52 connected between the supply voltage and ground, with the node 53 between the resistors being connected to the inverting input of the comparator 49. Resistors 54, 56 are connected together at a node 57 and coupled between the supply voltage and ground. The node 57 is coupled to the non-inverting input of the comparator 49. The resistors 51, 52 and 54, 56 are selected such that, during normal operation, the voltage at the node 53 exceeds that at the node 57.

In the event of a short circuit condition at the temperature dependent resistor 12, or in its connecting leads, the voltage at the cathode of the diode 39 drops, substantially to ground potential. This lowers the voltage at the node 53, so that the voltage at the node 57 exceeds that at the node 53. Therefore, the non-inverting input of the comparator 49 exceeds that at the inverting input, producing a positive output voltage from the comparator 49, which is coupled to a resistor 58 and a light emitting diode 59. Activation of the light emitting diode 59 by the positive voltage at the output of the comparator 49, provides a short circuit fault indication.

To connect the temperature dependent resistor 12 on the hose 19 to the bridge 11, the resistor 12 is connected to pins 61, 62 in the plug 13 by conductors 63, 64, respectively. When the plug 13 is connected with the receptacle 14, joining these two connector components together, the pins 61, 62 are in electrical contact with terminals 66, 67, respectively, of the receptacle 14. The terminals 66, 67 are in turn connected by conductors 68, 69, respectively, to the bridge circuit 11. When the plug and receptacle 13, 14 are disconnected, the temperature dependent resistor 12 is thereby removed from the bridge circuit 11.

In order to disconnect the open circuit and short circuit fault indicator circuitry from the bridge when the two connector components 13, 14 are disconnected, this circuitry is coupled to the node 31 of the bridge 11 via a jumper wire 71 on the plug 13. When the plug 13 and receptacle 14 are connected together, the node 31 is electrically connected to the diodes 38, 39 of the fault indicator circuitry by a conductor 72, a terminal 73 in the receptacle 14, a pin 74 in the plug 13, the jumper 71, a pin 76 in the plug 13, a terminal 77 in the receptacle 14, and a conductor 78. Therefore, whenever the plug 13 is disconnected from the receptacle 14, the pins 74 and 76 are disconnected from the terminals 73 and 77, and the fault detection circuitry is disconnected from the bridge 11.

In the illustrated form of the invention, the hose heater 11 is also coupled to the power supply 37 via pins 81, 82 in terminals 83, 84 in the connector components 13, 14 so that disconnecting the plug 13 from the receptacle 14 also disconnects the heater 21 from the heater power supply 37.

In one form of the invention, several temperature dependent resistors 12, bridges 11, heaters 21 and temperature indicators 16 are employed in a single hot melt adhesive system. In this particular system, each bridge has an associated connector 15 including a jumper 71. There are also diodes 38, 39 associated with each bridge circuit 11 for the fault condition indicating circuits 17, 18. However, in this particular form of the invention, a single open circuit fault indicator circuit 17 is connected to the cathode of each of the diodes 38, and a single short circuit fault indicator circuit 18 is connected to the anode of each of the diodes 39.

What is claimed is:

1. A bridge circuit system comprising:
   a bridge circuit including a variable impedance element which can be selectively connected and disconnected to the bridge circuit;
   means for sensing impedance variations in the variable impedance element when it is connected to the bridge circuit;
   fault detection means, which can be selectively connected and disconnected to the bridge circuit, for detecting impedance fault conditions of the variable impedance element when both said fault detection means and said variable impedance element are connected to said bridge; and
   electrical connector means, including a first connector component connected to the variable impedance element and a second connector component connected to the bridge circuit, for connecting the variable impedance element to the bridge circuit when the first and second connector components are connected together, and for connecting the fault detection means to the bridge circuit only when the first and second connector components are connected together.

2. The bridge circuit system of claim 1 in which the second connector component includes a first terminal electrically connected to the bridge circuit and a second terminal electrically connected to the fault detection means, the means for connecting the fault detection means to the bridge circuit comprising a conductor on the first connector component positioned to electrically connect said first and second terminals together when the first and second connector components are connected together.

3. A bridge circuit comprising:
   a resistance bridge circuit including a temperature dependent resistor which can be selectively connected and disconnected to the bridge circuit;
   means for sensing resistance variations in the temperature dependent resistor when it is connected to the bridge circuit;
   fault detection means which can be selectively connected and disconnected to the bridge circuit, for detecting resistance fault conditions of the temperature dependent resistor when said fault detection means and said variable impedance element are connected to said bridge; and
   electrical connector means, including a first connector component connected to the temperature dependent resistor and a second connector component connected to the bridge circuit, for connecting the temperature dependent resistor to the bridge circuit when the first and second connector components are connected together and for connecting the fault detection means to the bridge circuit only when the first and second connector components are connected together.

4. The bridge circuit system of claim 3 in which the second connector component includes a first terminal electrically connected to the bridge circuit and a second terminal electrically connected to the fault detection means, the means for connecting the fault detection means to the bridge circuit comprising a conductor on the first connector component positioned to electrically connect said first and second terminals together when the first and second connector components are connected together.

5. A bridge circuit system comprising:
   a bridge circuit including a variable impedance element, whose impedance varies with temperature, which can be selectively connected and disconnected to the bridge circuit;
   means for sensing impedance variations in the variable impedance element when it is connected to the bridge circuit;
   fault detection means, which can be selectively connected and disconnected to the bridge circuit, for detecting impedance fault conditions of the variable impedance element when both said fault detection means and said variable impedance element are connected to said bridge;
   a heater near the variable impedance element;
   a power source for the heater; and
   electrical connector means, including a first connector component connected to the variable impedance element and to the heater and a second connector component connected to the bridge circuit and to the power source, for connecting the variable impedance element to the bridge circuit and connecting the heater to the power source when the first and second connector components are connected together, and for connecting the fault detection means to the bridge circuit only when the first and second connector components are connected together.

6. A sensing circuit system comprising:
   a variable impedance element, whose impedance varies dependent upon a parameter to be sensed;
   means which can be selectively connected to the variable impedance element for sensing impedance variations in the variable impedance element;
   fault detection means, which can be selectively connected to the variable impedance element, for detecting impedance fault conditions of the variable impedance element; and electrical connector means, including a first connector component connected to the variable impedance element and a second connector component connected to the means for sensing impedance variations in the variable impedance element, for selectively connecting the variable impedance element to the means for sensing impedance variations in the variable impedance element when the first and second connector components are connected together, and for selectively connecting the fault detection means to the variable impedance element only when the first and second connector components are connected together.

* * * * *